United States Patent
Mattia et al.

(10) Patent No.: US 10,230,359 B1
(45) Date of Patent: Mar. 12, 2019

(54) DFE HYSTERESIS COMPENSATION (SPECIFIC)

(71) Applicants: IMEC VZW, Leuven (BE); Vrije Universiteit Brussel, Brussels (BE)

(72) Inventors: Oscar Elisio Mattia, Leuven (BE); Davide Guermandi, Leuven (BE)

(73) Assignee: IMEC VZW, Brussels (BE)

( * ) Notice: Subject to any disclaimer, the term of this patent is extended or adjusted under 35 U.S.C. 154(b) by 0 days.

(21) Appl. No.: 15/964,689

(22) Filed: Apr. 27, 2018

(51) Int. Cl.
*H03L 5/00* (2006.01)
*H03K 5/08* (2006.01)
*H03K 5/24* (2006.01)
*H03K 3/3562* (2006.01)

(52) U.S. Cl.
CPC ........... *H03K 5/086* (2013.01); *H03K 5/24* (2013.01); *H03K 3/3562* (2013.01)

(58) Field of Classification Search
None
See application file for complete search history.

(56) References Cited

U.S. PATENT DOCUMENTS

| | | | |
|---|---|---|---|
| 6,084,538 A | 7/2000 | Kostelnik et al. | |
| 6,087,873 A | 7/2000 | Alexander | |
| 6,316,978 B1 | 11/2001 | Shacter | |
| 7,030,657 B2 * | 4/2006 | Stojanovic | H04L 25/028 326/87 |
| 7,433,401 B1 * | 10/2008 | Roo | H04L 25/03057 375/233 |
| 7,542,508 B2 * | 6/2009 | Marlett | H04L 25/03057 375/233 |
| 7,680,180 B2 * | 3/2010 | Zhang | H04L 25/03057 375/233 |
| 7,817,714 B2 * | 10/2010 | Bae | H04L 25/03057 375/229 |
| 8,243,782 B2 * | 8/2012 | Mobin | H04L 25/03343 375/232 |
| 9,178,688 B2 * | 11/2015 | Lin | H04L 7/0025 |
| 9,288,086 B2 * | 3/2016 | Toifl | H04L 25/03057 |
| 9,467,315 B2 * | 10/2016 | Dallaire | H04L 25/061 |
| 9,628,302 B2 * | 4/2017 | Francese | H04L 25/03057 |
| 9,654,086 B1 | 5/2017 | Fifield et al. | |
| 9,705,544 B2 * | 7/2017 | van de Beek | H04B 1/40 |
| 2006/0049845 A1 * | 3/2006 | Jaussi | H04L 25/03057 326/38 |

(Continued)

OTHER PUBLICATIONS

Stojanovic et al., "Autonomous Dual-Mode (Pam2/4) Serial Link Transceiver with Adaptive Equalization and Data Recovery", IEEE Journal of Solid-State Circuits, vol. 40, Issue 4, Apr. 2005.

(Continued)

*Primary Examiner* — Lincoln Donovan
*Assistant Examiner* — Khareem E Almo
(74) *Attorney, Agent, or Firm* — Moser Taboada (57) ABSTRACT

According to a first aspect of the present inventive concept there is provided an equalizer system comprising a decision feedback equalizer (DFE), the DFE comprising:
a static comparator configured as a decision device of the DFE; and
a feedback path comprising a set of filter taps including at least a first filter tap;
wherein the static comparator presents hysteresis and wherein a tap coefficient of the first filter tap is set such that an input signal level of the static comparator is shifted to compensate for the hysteresis.

13 Claims, 8 Drawing Sheets

(56) References Cited

U.S. PATENT DOCUMENTS

| | | | | |
|---|---|---|---|---|
| 2006/0056502 | A1* | 3/2006 | Callicotte | H03H 21/0001 |
| | | | | 375/232 |
| 2009/0027086 | A1 | 1/2009 | Trifonov | |
| 2009/0296799 | A1* | 12/2009 | Casas | H04L 25/0212 |
| | | | | 375/231 |
| 2009/0304066 | A1* | 12/2009 | Chmelar | H03M 1/002 |
| | | | | 375/233 |
| 2012/0057627 | A1* | 3/2012 | Chan | H04L 25/03057 |
| | | | | 375/233 |
| 2013/0278294 | A1* | 10/2013 | Shibasaki | H03K 5/00 |
| | | | | 327/97 |
| 2015/0358006 | A1 | 12/2015 | Chen | |
| 2017/0019276 | A1* | 1/2017 | Francese | H04L 25/03063 |
| 2018/0262373 | A1* | 9/2018 | Shibasaki | H04L 25/063 |

OTHER PUBLICATIONS

Jeeradit et al., "Characterizing Sampling Aperture of Clocked comparators", IEEE Symposium on VLSI Circuit, 2008.

Shekhar et al., "Design Considerations for Low-Power Receiver Front-End in High-Speed Data Links", IEEE Custom Integrated Circuits Conference (CICC), 2013.

Tretter et al., "Design and Characterization of a 3-bit 24-Gs/s Flash ADC in 28-nm Low-Power Digital CMOS", IEEE Transactions on Microwave Theory and Techniques, vol. 64, Issue 4, Apr. 2016.

Peng et al., "6.1 A 56Gb/s PAM-4/NRZ Transceiver in 40nm CMOS", IEEE International Solid-State Circuits Conference (ISSCC), 2017.

\* cited by examiner

DFE HYSTERESIS COMPENSATION (SPECIFIC)

TECHNICAL FIELD

The present inventive concept relates to an equalizer system and a method for operating an equalizer system.

BACKGROUND

Analog front ends of digital signal processors (DSPs), for instance in serial link receivers, commonly include equalizers to compensate for frequency-dependent amplitude and phase effects on the signal caused by the transmission channel.

Figure 1:
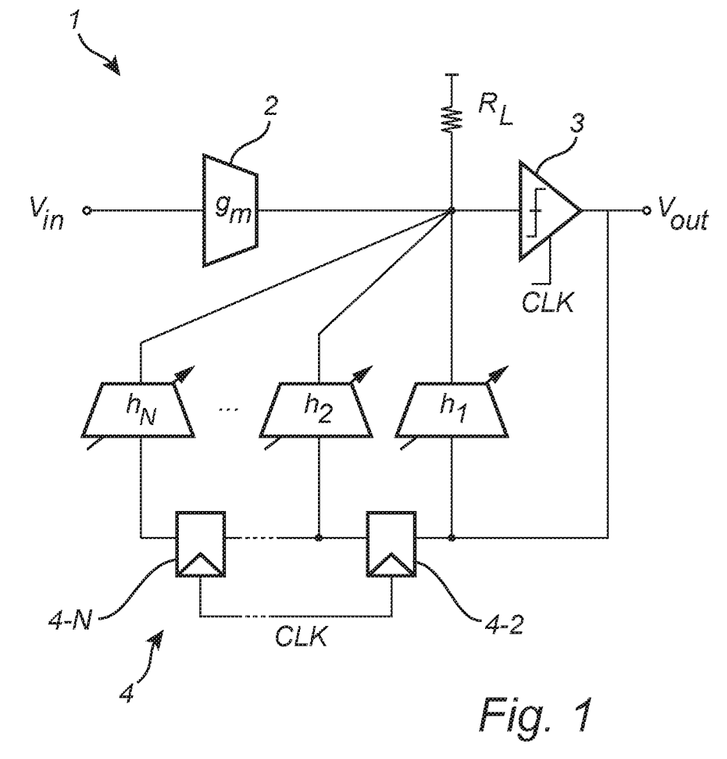
FIG. 1 is a schematic of an equalizer system comprising a DFE.

FIG. 1 shows a schematic of a signal processing device which may be employed for analog baseband equalization. The device comprises an equalizer system 1 comprising a decision feedback equalizer (DFE). The DFE comprises a decision device in the form of a comparator 3 and a feedback path 4 including a delay line with a number N of taps with coefficients $h_1, h_2, \ldots h_N$, where $h_1$ represents the first tap coefficient. Through the feedback path the DFE may cancel postcursor inter-symbol-interference (ISI), at the input of the comparator 3. The sources of the ISI may be various and may depending on the type of context. For instance, ISI may be due to multi-path propagations (e.g. of mmWave wireless channels), bandwidth-limited low-pass channels (either optical or wireline) and/or ISI induced by preceding frontends.

In view of the ever increasing data rates handled in signal processing devices, it is becoming increasingly important to design equalizers for speed and decision robustness. One notable element of the DFE-based equalizer system is the decision device, i.e. the comparator 3 shown in FIG. 1. Two types of comparators commonly used in high speed applications are dynamic comparators and static comparators. Dynamic comparators offer an advantage of no static power consumption and no hysteresis, due to a reset phase after the comparison. However, dynamic comparators also have disadvantages such as high kick-back noise and high sensitivity to process, supply voltage and temperature (PVT) variations. On the other hand, static comparators may be realized with a comparably small number of transistors, allows high-speed decisions, provides inductive peaking possibilities, do not suffer from kick-back noise issues and are comparably robust against PVT variations.

SUMMARY

The inventors have realized that although static comparators provide various benefits compared to dynamic comparators when used in a DFE-based equalizer systems, they present a drawback in relation to dynamic comparators in that they may exhibit significant hysteresis.

Hysteresis in a comparator implies different thresholds for high-to-low and low-to-high transitions at the comparator input. Hysteresis may degrade the performance of the comparator in terms of decision robustness and jitter, thereby producing ripple effects in other parts of the signal-chain such as reduced receiver sensitivity and increased bit error rates (BER), which may adversely impact the throughput and overall performance of the signal processing device comprising the equalizer system.

In dynamic comparators, a reset phase may be implemented after each comparison, wherein hysteresis may be avoided. However, as further realized by the inventors, implementing hysteresis compensation in a static comparator by adding a reset phase would subtract from the effective time available for comparison, for a same clock frequency.

An objective of the present inventive concept is thus to provide an improvement relating to signal processing devices comprising a DFE-based equalizer system. More specifically, an objective is to provide an equalizer system comprising a DFE-based equalizer system which enables high-throughput and improved decision robustness.

According to a first aspect of the present inventive concept there is provided an equalizer system comprising a decision feedback equalizer (DFE), the DFE comprising:

a static comparator configured as a decision device of the DFE; and a feedback path comprising a set of filter taps including at least a first filter tap;

wherein the static comparator presents hysteresis and wherein a tap coefficient of the first filter tap is set such that an input signal level of the static comparator is shifted to compensate for the hysteresis.

The first inventive aspect is based on the technical insight that an improved DFE-based equalizer system may be provided by using a static comparator as decision device and by compensating for the input hysteresis of the static comparator using the first filter tap of the feedback path. The equalization system may thus benefit from the speed offered by a static comparator while performance degrading effects due to the comparator hysteresis may be avoided or at least mitigated.

As the hysteresis compensation is achieved by shifting the comparator input signal level, no reset phase as in dynamic comparators is needed. Rather, the first filter tap may provide additional voltage levels compared to a conventional filter tap, which additional levels allows to compensate for the hysteresis.

Since the hysteresis compensation may be implemented in the first filter tap, additional circuitry for hysteresis compensation may be avoided, thereby allowing an area and power efficient circuit implementation.

As may be understood, the precise degree of shifting to be applied to compensate for the hysteresis is dependent on the specifics of the static comparator as well as on to which extent the hysteresis is to be compensated for (i.e. completely, substantially completely or only partially). For instance, in some applications it may be advantageous to preserve some degree of hysteresis for noise resistance. However, having a first filter tap coefficient set such that an input signal level of the comparator is shifted to compensate for the hysteresis, makes it possible to compensate for the different thresholds for high-to-low and low-to-high transitions.

As used herein, the term "hysteresis" implies different thresholds for high-to-low and low-to-high transitions of the comparator input signal. In other words, the hysteresis may be such that the static comparator presents a first threshold in response to an increasing/rising input signal level and a second threshold, different from the first threshold, in response to a decreasing/falling input signal level. A "threshold voltage" of a comparator in this context refers to the (voltage) level of the comparator input voltage or differential comparator input voltage at which the output of the comparator switches state. Accordingly, the degree of hysteresis or amount of hysteresis of a comparator may be defined as the difference between the two thresholds. Accordingly, it may be understood that compensating for the hysteresis implies that the shifting of the input signal is towards the first threshold in response to an increasing input signal level (i.e. when the output of the comparator is a low state/logic level and the input signal level is rising) and towards the second threshold in response to a decreasing input signal level (i.e. when the output of the comparator is in a high state/logic level and the input signal level is falling).

The term "decision feedback equalizer" ("DFE") is herein used to refer to a signal equalizer configured to, by means of the feedback path, filter an input signal of the DFE by N recently received symbols, each symbol multiplied by a respective filter tap coefficient. The DFE may hence remove post-cursor inter-symbol-interference (ISI) due to the N previously received symbols from a received signal. N may be any number equal to or greater than 1.

The equalizer system may comprise a signal input and a signal output wherein the DFE may be coupled between the signal input and the signal output of the equalizer system. The static comparator may comprise a static comparator input coupled to the signal input and a static comparator output coupled to the signal output of the equalizer system. The feedback path may be coupled from the static comparator output to the static comparator input via the set of filter taps.

A "static comparator" is a comparator suitable or configured for clocked operation and draws a constant or "static" current from the power supply, independent of the clock frequency. Hence, the output of a static comparator may be static in the sense that the output signal level is maintained for the duration of the (reference) clock period (i.e. between clock transitions of a same polarity). The output signal level may change only at each new reference clock period.

A static comparator may comprise a master latch and a slave latch. The master latch may comprise a first amplifier circuit and a first latch circuit coupled to an output of the first amplifier circuit. The slave latch may comprise a second amplifier circuit having an input coupled to the output of the first amplifier circuit, and a second latch circuit coupled to an output of the second amplifier circuit.

The static comparator may be configured to alternatingly: enable the first amplifier circuit and the second latch circuit during a first portion of a reference clock period, and enable the first latch circuit and the second amplifier circuit during a second portion of a reference clock period.

According to one embodiment, the equalizer system may further comprise a tap coefficient adaption circuit, the tap coefficient adaption circuit comprising:
an input stage comprising an auxiliary comparator with an adjustable threshold, the auxiliary comparator having an auxiliary comparator input coupled to a signal input of the equalizer system, the auxiliary comparator further having an auxiliary comparator output:
wherein said adjustable threshold level is set to a third threshold in response to a high-level output signal level at the output of the static comparator, and
wherein said adjustable threshold level is set to a fourth threshold in response to a low-level output signal level at the output of the static comparator; and
a coefficient determination stage having a first input coupled to the auxiliary comparator output and a second input coupled to an output of the static comparator, and being configured to determine the tap coefficient to reduce an error between a signal received at the first input and a signal received at the second input.

In other words, if/when the signal level at the static comparator output is a low level output, the adjustable threshold is set to the third threshold. On the other hand, if/when the signal level at the static comparator output is a high level output, the adjustable threshold is set to the fourth threshold.

"Third" and "fourth" in connection with a "threshold" of the auxiliary comparator should hereby be understood as mere labels for two different thresholds which the auxiliary comparator may be configured with.

Hence, the tap coefficient adaption circuit may determine the tap coefficient of the first filter tap such that the error is minimized or at least reduced, the error (i.e. a difference signal) representing a difference between the first and second input signals to the coefficient determination stage. The tap coefficient adaption circuit thus enables the tap coefficient of the first filter tap to be updated in view of fluctuating channel conditions that result in variations of the channel impulse response.

Setting the threshold of the auxiliary comparator to either the third threshold or the fourth threshold based on the level at the static comparator output the tap coefficient may be determined while taking into account the hysteresis of the static comparator. Had a tap coefficient adaption circuit been configured in accordance with conventional practice the auxiliary comparator threshold would be fixed to a single constant level, not being dependent on the state of the static comparator output. This would result in a sub-optimal tap coefficient not allowing compensation for hysteresis of the static comparator.

The auxiliary comparator is advantageously a comparator presenting zero or substantially zero hysteresis. The smaller the amount of hysteresis of the auxiliary comparator, the better the value of the tap coefficient may be determined.

The static comparator may present a first threshold in response to an increasing input signal level and a second threshold in response to a decreasing input signal level, and wherein the tap coefficient adaption circuit may be configured such that a difference between the third and fourth thresholds of the auxiliary comparator corresponds to a difference between the first and second thresholds. The threshold of the auxiliary comparator may hence be switched between two different levels differing by an amount corresponding to the amount of hysteresis of the static comparator.

According to one embodiment, the equalizer system may further comprise a tap coefficient adaption circuit, the tap coefficient adaption circuit comprising:
an input stage comprising:
an auxiliary comparator having a first auxiliary comparator input coupled to a signal input of the equalizer system, the auxiliary comparator further having a second auxiliary comparator input and an auxiliary comparator output, and
a threshold selector circuit having an output coupled to the second auxiliary comparator input and being configured to output a third threshold level to the second auxiliary comparator input in response to a high-level output signal level at the output of the static comparator, and a fourth threshold level to the second auxiliary comparator input in response to a low-level output signal level at the output of the static comparator; and
the tap coefficient adaption circuit further comprising a coefficient determination stage having a first input coupled to the auxiliary comparator output and a second input coupled to an output of the static comparator, and being configured to determine said tap coefficient to reduce an error between a signal received at the first input and a signal received at the second input.

The present embodiment generally provides advantages corresponding to those of the afore-mentioned embodiment including a tap coefficient adaption circuit. The threshold selector circuit outputting either a third threshold level or fourth threshold level to the second auxiliary comparator input allows the threshold level of the auxiliary comparator to be switched between a third threshold (i.e. the third threshold level) and a fourth threshold (i.e. the fourth threshold level) with a comparably small amount of circuitry. "Third" and "fourth" in connection with a "threshold level" output by the threshold selector circuit should hereby be understood as mere labels for two different signal levels which the threshold selector circuit may output. Correspondingly, "third" and "fourth" in connection with a "threshold" of the auxiliary comparator should hereby be understood as mere labels for two different thresholds which the auxiliary comparator may be configured with.

The static comparator may present a first threshold in response to an increasing input signal level and a second threshold in response to a decreasing input signal level, and wherein the threshold selector circuit may be configured such that a difference between the third and fourth threshold levels corresponds to a difference between the first and second thresholds. The threshold of the auxiliary comparator may hence be switched between two different levels differing by an amount corresponding to the amount of hysteresis of the static comparator.

According to one embodiment, the static comparator may form a first static comparator of the equalizer system and the equalizer system may further comprise a second static comparator presenting hysteresis, the first and the second static comparators being coupled between a common input node and a common output node. The feedback path may be coupled from the common output node to the common input node via the set of filter taps and wherein the tap coefficient of the first filter tap may be set such that a signal level at the common input node is shifted to compensate for the hysteresis of the first and the second static comparators.

By the equalizer system comprising the second static comparator, the equalizer system may handle multi-level input signals and not only binary input signals.

Since identically sized static comparators fabricated on a same wafer or chip typically are subjected to the same process conditions they tend to present a same hysteresis characteristic. That is, the first and the second static comparators may be formed on a same wafer or chip. Thus, the first and the second static comparator may present a same amount of hysteresis, at least substantially the same amount. Accordingly, since the hysteresis compensation is implemented in the first filter tap which is coupled to the common input node the first filter tap may compensate for hysteresis of both the first and the second comparator.

The equalizer system may be configured to apply a different static offset to an input signal level of the first static comparator and the second static comparator. The static comparators may thereby be configured with different "nominal" (or "ideal") threshold levels. A nominal threshold level of a static comparator may be the threshold level about which the input hysteresis of the static comparator is centered.

The equalizer system may further comprise a tap coefficient adaption circuit, the tap coefficient adaption circuit comprising:

an input stage comprising an auxiliary comparator with an adjustable threshold, the auxiliary comparator further having an auxiliary comparator input coupled to said common input node of the equalizer system and having an auxiliary comparator output:
    wherein said adjustable threshold is set to a third threshold in response to a high-level output signal level at the output of the first static comparator, and
    wherein said adjustable reference is set to a fourth threshold in response to a low-level output signal level at the output of the first static comparator; and
a coefficient determination stage having a first input coupled to the auxiliary comparator output and a second input coupled to an output of the static comparator, and being configured to determine said tap coefficient to reduce an error between a signal received at the first input and a signal received at the second input.

The equalizer system may according further comprise a tap coefficient adaption circuit, the tap coefficient adaption circuit comprising:

an input stage comprising:
    an auxiliary comparator having a first auxiliary comparator input coupled to said common input node of the equalizer system, the auxiliary comparator further having a second auxiliary comparator input and an auxiliary comparator output, and
    a threshold selector circuit having an output coupled to the second auxiliary comparator input and being configured to output a third threshold level to the second auxiliary comparator input in response to a high-level output signal level at the output of the first static comparator, and a fourth threshold level to the second auxiliary comparator input in response to a low-level output signal level at the output of the first static comparator; and
the tap coefficient adaption circuit further comprising a coefficient determination stage having a first input coupled to the auxiliary comparator output and a second input coupled to an output of the static comparator, and being configured to determine said tap coefficient to reduce an error between a signal received at the first input and a signal received at the second input.

The two above tap coefficient adaption circuit embodiments generally provides advantages corresponding to those of the afore-mentioned embodiments including a tap coefficient adaption circuit, however in an equalizer system comprising both the first and the second static comparator. Moreover, since the feedback path and the first filter tap is used for both the first and the second static comparator a single tap coefficient adaption circuit may be used although the equalizer system includes more than one static comparator.

In both of these embodiments including the tap coefficient adaption circuit the first static comparator may present a first threshold in response to an increasing input signal level and a second threshold in response to a decreasing input signal level, and the second static comparator may present a fifth threshold in response to an increasing input signal level and a sixth threshold in response to a decreasing input signal level, wherein a difference between the first and the second threshold corresponds to a difference between the fifth and sixth threshold, and wherein the tap coefficient adaption circuit may be configured such that a difference between the third and fourth thresholds of the auxiliary comparator corresponds to a difference between the first and second thresholds.

"Fifth" and "sixth" in connection with a "threshold" of the second comparator should hereby be understood as mere labels for two different thresholds which the second auxiliary comparator may be configured with.

According to a second aspect there is provided a method for operating an equalizer system, the method comprising:

feeding an input signal to a decision feedback equalizer (DFE) of the equalizer system, the DFE comprising a static comparator configured as a decision device of the DFE, the static comparator presenting hysteresis, and the DFE further comprising a feedback path comprising a set of filter taps including at least a first filter tap; and setting a tap coefficient of the first tap such that an input signal level of the static comparator is shifted to compensate for the hysteresis.

This second aspect may generally present the same or corresponding advantages as the former first aspect. The above discussion of the first aspect, as well as the embodiments and variations thereof, accordingly applies correspondingly to second aspect. Reference is thus made to the above.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

FIG. 1 includes a block-level diagram of an equalizer system 1 (hereinafter "system 1") comprising, as discussed in the background section, a DFE comprising a static comparator 3, and a feedback path 4. The system 1 may for instance be implemented in a front end of a DSP, for instance in a serial link receiver, an optical receiver or a wireless mmWave receiver The DFE is coupled between a signal input $V_{in}$ and a signal output $V_{out}$ of the system 1. The system 1 may as shown further comprise an optional input transconductor 2 for converting a voltage signal received at the input $V_{in}$ by a gain factor $R_L*g_m$, and allowing the tap values $h_1, h_2, \ldots h_N$ to be summed in the current domain.

The DFE comprises a set of N filter taps with filter coefficients $h_1, h_2, \ldots h_N$. The number of filter taps N may be selected in accordance with the equalizing requirements for the particular application and may for instance be 2, 3 or more. For the purpose of implementing the hysteresis compensation, as will be described further below, it is however sufficient with the first filter tap (i.e. N=1). The filter taps are arranged along a delay line including a set of delay elements 4-2 through 4-N, each delay element providing a delay corresponding to a symbol length or duration. Thus, a consecutive sequence of filter taps may compensate for ISI due to the immediately previous symbol (i.e. the first or center filter tap) up to the $N^{th}$ earlier symbol (i.e. the $N^{th}$ filter tap). Each one of the delay elements 4-2 through 4-N may be implemented by a respective latch operating on basis of a reference clock CLK of the equalizer system 1 (which as indicated in FIG. 1 may be a same as a reference clock CLK input to the static comparator 3). The periodicity of the reference clock CLK may correspond to the periodicity of the symbol length. However, any other conventional delay element configured with a delay corresponding to the reference clock frequency may be used instead of a latch.

In use of the system 1, the operation may generally proceed in correspondence to a conventional DFE-based equalizer system as described in the background section. Accordingly, ISI from up to the $N^{th}$ earlier symbol may be filtered from the input signal of the static comparator 3. The DFE filter coefficients may be updated at regular intervals (typically at a fraction of the symbol rate) by a tap coefficient adaption circuit, as will be further described below.

However, in contrast to a conventional system where the tap coefficient of the first tap is set to compensate only for ISI caused by the preceding symbol the tap coefficient is in the system 1 set to compensate also for the hysteresis of the static comparator 3. In other words, assuming a first tap coefficient $h_1=k_1$ would compensate for the ISI, the first tap coefficient of the system 1 is instead set as $h_1=k_1+k_{HYST}$ where $k_{HYST}$ corresponds to the hysteresis of the static comparator 3.

Figure 2:
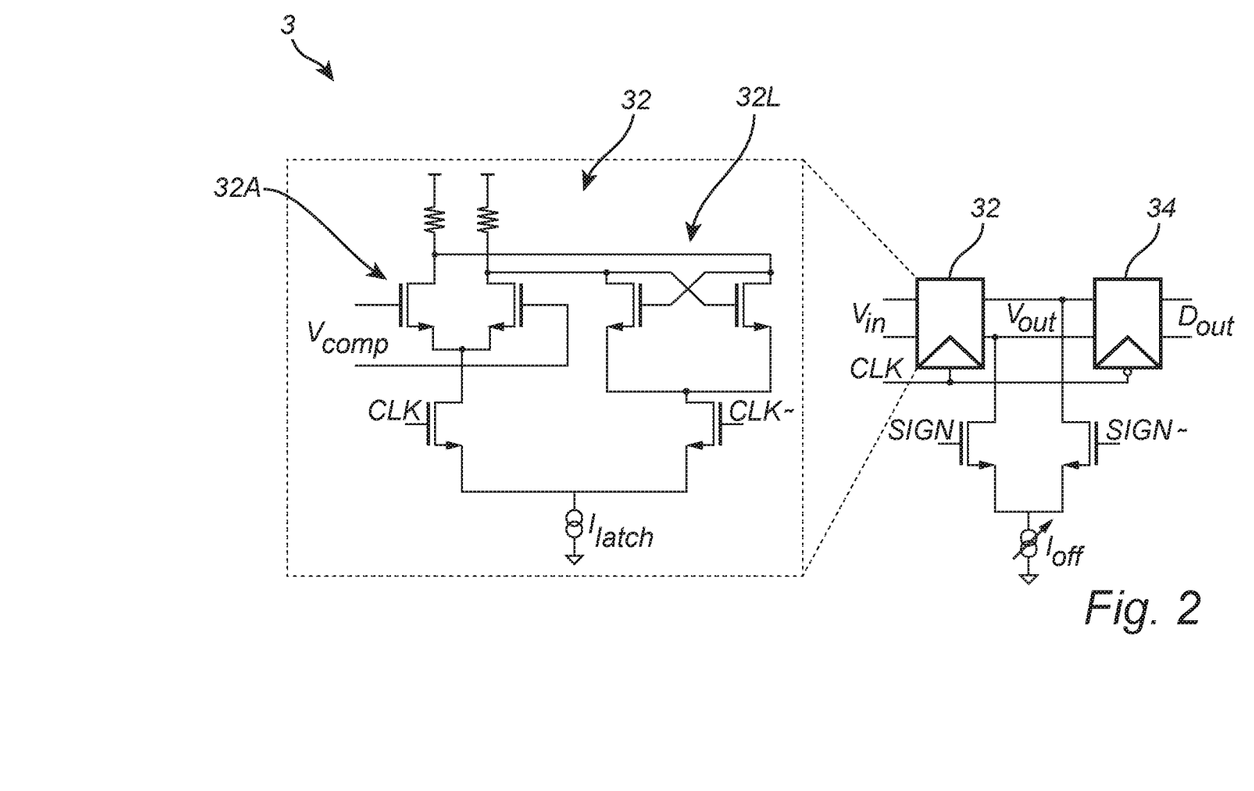
FIG. 2 is a schematic of a static comparator.

FIG. 2 schematically shows a circuit layout of the static comparator 3. The static comparator 3 comprises a master latch 32 and a slave latch 34. The master latch 32 comprises, as shown in the enlargement, an amplifier circuit 32A comprising a differential pair, and an associated latch circuit 32L. The differential pair may for instance be formed by a pair of field-effect transistors (FETs) such as MOSFETs or MISFETs. The latch circuit 32L may as shown comprise a cross-coupled pair of transistors, for instance FETs such as MOSFETs or MISFETs.

The amplifier circuit 32A and the latch circuit 32L are each coupled between a high power supply (e.g. VDD) and a current sink implemented by a controllable current source $I_{LATCH}$, such as a digitally programmable current digital-to-analog converter (DAC). However, a constant current source is also possible. Also a resistor-based implementation where connection to ground through an appropriately chosen resistance may be provided instead of a current source.

The comparator 1 may as shown further comprise an offset compensation current source 7 with a sign controlled by complementary static inputs SIGN, SIGN~ that determine the sign of the offset correction to be applied.

During operation, the amplifier circuit 32A and the latch circuit 32L may as shown be alternatingly coupled to $I_{LATCH}$ (or alternatively to ground through a resistance) via a pair of switches controlled by the complementary reference clock signals CLK, CLK~. When enabled, the amplifier circuit 32A is configured to sense the signal levels present at the inputs of the master latch 32 and provide amplified signals at the outputs of the master latch 32. When enabled, the latch circuit 32L is configured to latch the signal levels present at the outputs of the master latch 32.

The slave latch 34 has a configuration and operation corresponding to that of the master latch 32, which therefore for conciseness will not be repeated. The phases of the complementary reference clock signals controlling the operation of the slave latch 34 are however inverted with respect to the complementary reference clock signals controlling the master latch 32. Accordingly, when CLK~ is high the amplifier circuit of the slave latch 34 is enabled and the latch circuit of the slave latch 34 is disabled. Conversely, when CLK is high the amplifier circuit of the slave latch 34 is disabled and the latch circuit of the slave latch 34 is enabled.

Figure 3:
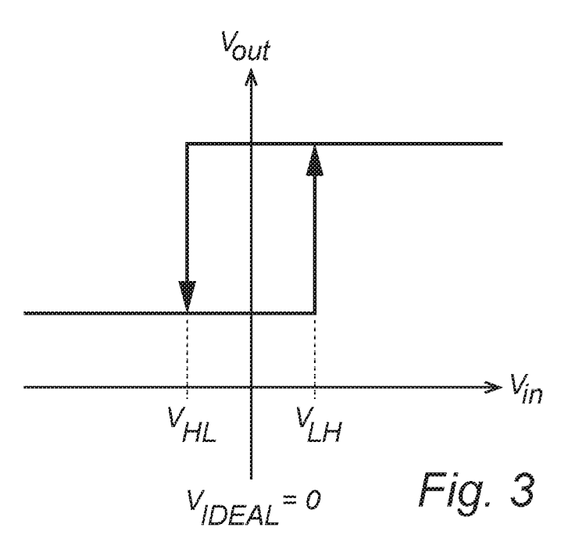
FIG. 3 is a diagram illustrating the concept of comparator hysteresis.

As has been realized by the inventors, a comparator circuit with a master and slave latch configuration such as that shown in FIG. 2 may however exhibit significant hysteresis. A major part of the hysteresis may likely be attributed to memory effects in the latches 32, 34. The concept of comparator hysteresis is schematically illustrated in FIG. 3. The ideal/desired threshold level may for the sake of simplicity be defined as the zero voltage, i.e. $V_{IDEAL}=V_{IN}=0$ (i.e. the mid-point between the low-to-high and the high-to-low thresholds). However, a voltage $V_{IN}=V_{LH}$ greater than the ideal threshold level is in this case needed to switch the comparator output when the input transitions from a low level to a high level. Conversely, a voltage $V_{IN}=V_{HL}$ smaller than the ideal threshold level is in this case needed to switch the comparator output when the input transitions from a high level to a low level.

Figure 4:
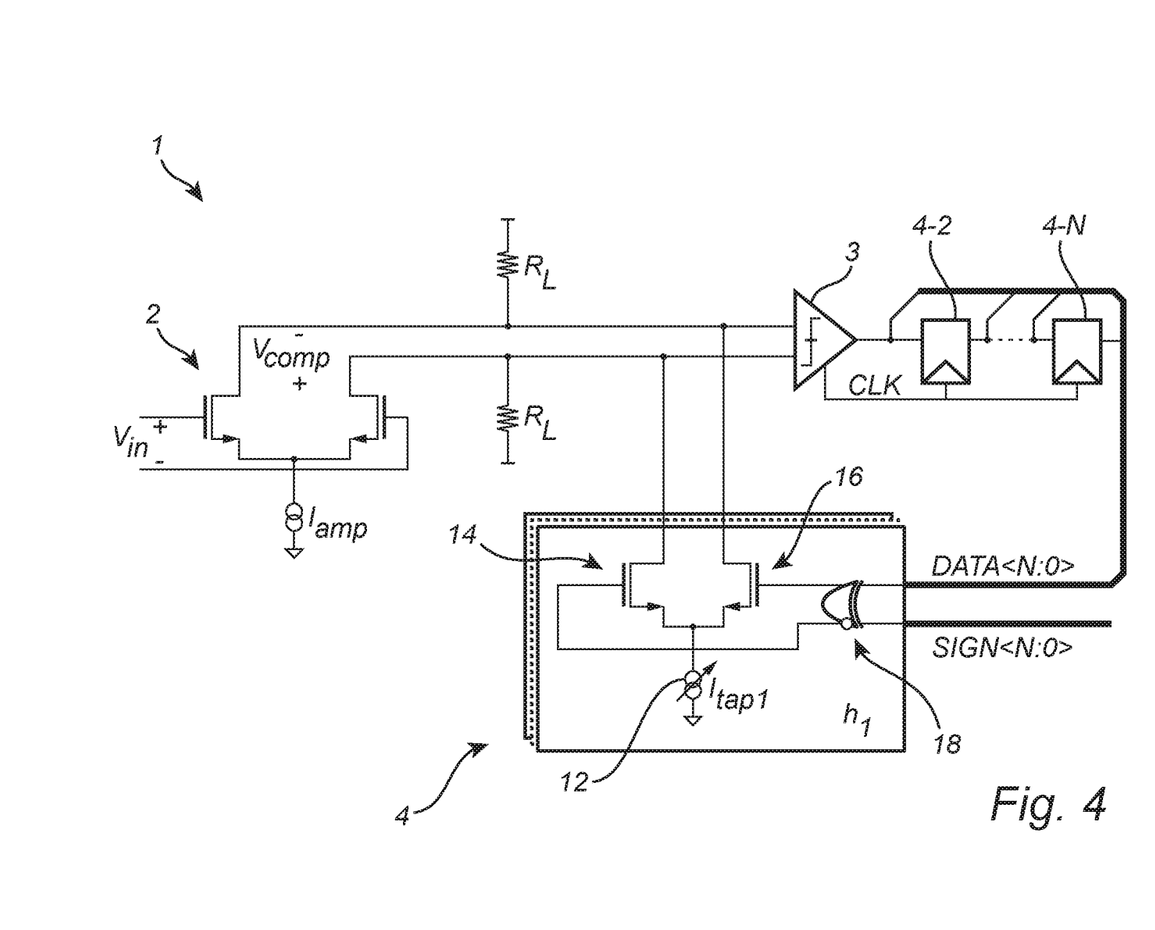
FIG. 4 is a more detailed schematic of an equalizer system comprising a DFE.

FIG. 4 shows in further detail one possible implementation of an equalizer system 1 comprising a DFE including a static comparator 3 and a feedback path 4. FIG. 4 shows differential inputs and outputs instead of the highly schematic single-ended signal inputs and outputs of the static comparator 3. The transconductor 2 is formed by a differential pair. The output of the transconductor 2 is denoted Vcomp which is supplied to the input of the static comparator 3. However, to facilitate understanding $V_{in}$ will in the following be used to refer to the input signal of the static comparator 3 (equivalent to assuming that the gain of the input transconductor 2 is equal to 1 and the output being non-inverted).

In the illustrated implementation the DFE is a resistive sum DFE wherein each one of the filter taps is implemented by a respective controllable current source. In FIG. 4 the first filter tap is shown comprising a current source 12 implemented as a current sink in the form of a digitally programmable current DAC, configured to draw a current $I_{TAP1}$ from either of the signal inputs of the static comparator 3. The further filter taps present a corresponding configuration. The magnitude of $I_{TAP1}$ corresponds to the tap coefficient $h_1$. Accordingly the total current of $I_{TAP1}$ corresponds to the sum of the first tap ISI compensation and the hysteresis compensation part, as discussed above.

The current sink 12 is configured to be selectively coupled to either a first input of the static comparator 3 or a second input of the static comparator 3, via a pair of switches 14, 16 controlled on the basis of complementary control signals output by an XOR-element in turn responsive to the symbol output (denoted DATA<N:0>) by the static comparator 3 and the respective sign of the equalizer coefficients $h_1, h_2, \ldots h_N$ (denoted SIGN<N:0>).

As may be appreciated by the skilled person, other implementations than resistive sum DFEs are also possible such as: current integration, where the resistive loads $R_L$ are replaced by a respective PMOS device which in one phase charges the input node to VDD, while in the other phase are turned off; or capacitive summing, where a voltage is sampled at the input of the comparator and each tap equalizer is implemented by a charge-sharing capacitive DAC. In a further variation, a binary half-rate DFE could be implemented wherein two comparators could be operated at half the clock rate. The filter coefficients could be summed at the input of the complementary comparators. These implementations are common variations of DFEs, which per se are known in the art.

FIG. 5a through 5d are eye diagram representations of the input signal levels of a comparator. In the eye diagrams $t_{CLK}$ denotes the clock period and CLK denotes the flank of the reference clock. $+V_{in}$ represents a predetermined high level of an input signal (i.e. a high logic level which may be associated with for instance a "1") and $-V_{in}$ represents a predetermined low level of the input signal (i.e. a low logic level which may be associated with for instance a "0").

Figure 5A:
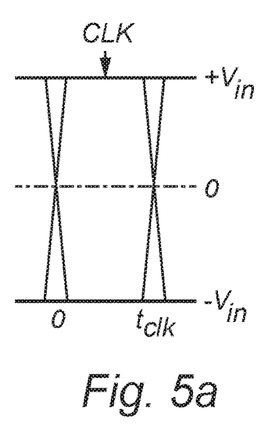
FIG. 5a-d are eye diagrams illustrating hysteresis and hysteresis compensation.

FIG. 5a is an input eye diagram for a comparator without hysteresis. Hence, the comparator exhibits a single threshold or switch point, indicated by the nominal zero voltage (dashed line). The diagram in FIG. 5a may for instance be representative for a dynamic comparator implementing a reset phase.

Figure 5B:
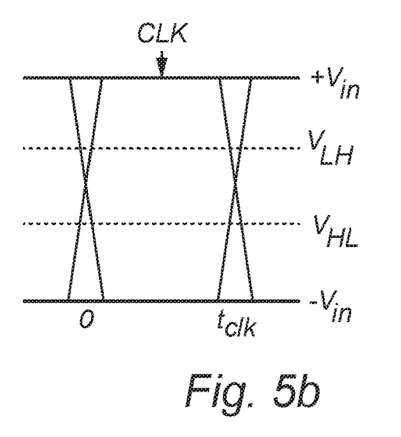

FIG. 5b is an input eye diagram for the static comparator 3 with hysteresis. Hence, the comparator 3 exhibits a threshold $V_{HL}$ in response to a high-to-low signal transition (i.e. a falling input signal) and a threshold $V_{LH}$ in response to a low-to-high signal transition (i.e. a raising input signal). In FIG. 5b the thresholds $V_{HL}$ and $V_{LH}$ are shown to be symmetrical about the ideal threshold voltage. Static comparator, for instance when implemented as shown in FIG. 2, may typically exhibit symmetric, or at least substantially symmetric, hysteresis.

Figure 5C:
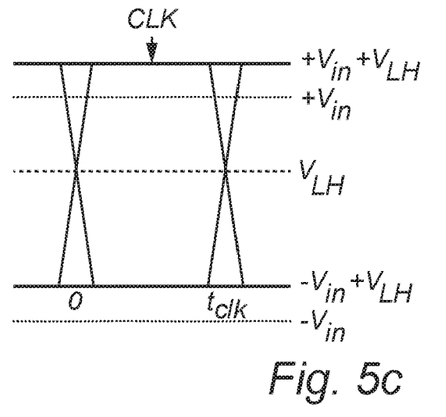
Figure 5D:
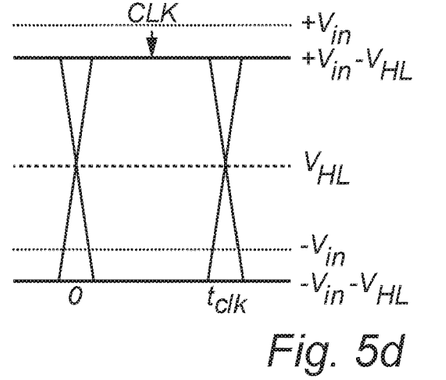

FIGS. 5c and 5d are input eye diagrams for the static comparator 3 with the hysteresis behavior illustrated in FIG. 5b, however where the first filter tap hysteresis compensation disclosed above is applied. It should be noted that the eye diagrams are equalized eye diagrams, to facilitate understanding of the hysteresis compensation. In other words, the ISI has already has been subtracted from the input signals. FIG. 5c illustrates the resulting comparator input signal shift when the comparator output signal level is low, i.e. the comparator decision output for the previous symbol was low. FIG. 5d illustrates the resulting comparator input signal shift when the comparator output signal level is high, i.e. the comparator decision output for the previous symbol was high. As may be seen, the hysteresis compensation is achieved by shifting or offsetting the input signal level such that the eye diagram is centered about either the $V_{LH}$ threshold or the $V_{HL}$ threshold.

As noted above, the equalizer system 1 may comprise a tap coefficient adaption circuit for dynamically adapting the tap coefficient in response to changing channel conditions. One tap coefficient adaption circuit may be used for all of the N filter taps. The following description will focus on the part of the tap coefficient adaption circuit associated with the first filter tap h1.

Figure 6A:
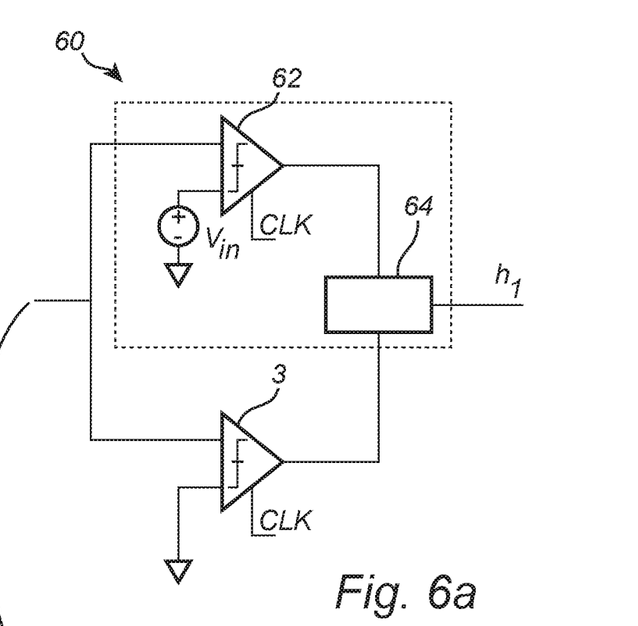
FIG. 6a-d are schematics of tap coefficient adaption circuits.

FIG. 6a schematically illustrates a naïve implementation of a tap coefficient adaption circuit 60 comprising an input stage including an auxiliary comparator 62 with a threshold voltage set to $V_{in}$ and a tap coefficient determination stage 64. The auxiliary comparator 62 monitors the input eye diagram and correlates its output with the data. The tap coefficient determination stage 64 may implement a conventional tap coefficient determination technique, such as a least-mean-square (LMS) based adaptation for the DFE coefficients, as per se is known in the art.

Figure 6B:
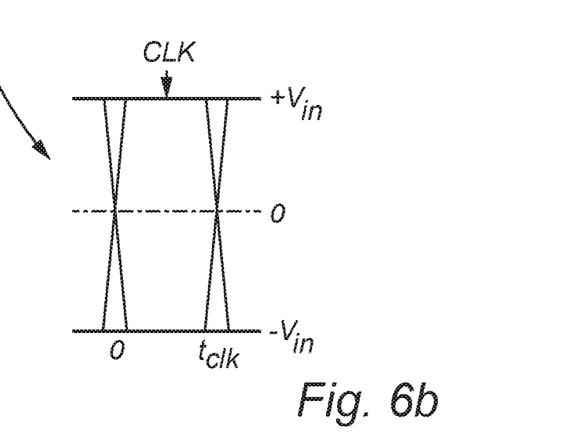

Assume the tap coefficient adaption circuit 60 is adapting to a channel impulse response that contains a single tap of postcursor ISI with voltage magnitude k1. According to the previously described hysteresis compensation scheme, to completely compensate for the hysteresis the value for the first tap coefficient should be (assuming for sake of simplicity that h1 is in a voltage domain) $h1=k1+k_{HYST}$, where $k_{HYST}=(V_{LH}-V_{HL})/2$ (in a voltage domain). However, since the threshold of the auxiliary comparator 62 is set to $V_{in}$, the tap value will converge to the value that minimizes the error around $V_{in}$, resulting in the wrong value of $h1=k1$. The resulting equalized input eye diagram for the auxiliary comparator 62 is shown in FIG. 6b.

Figure 6C:
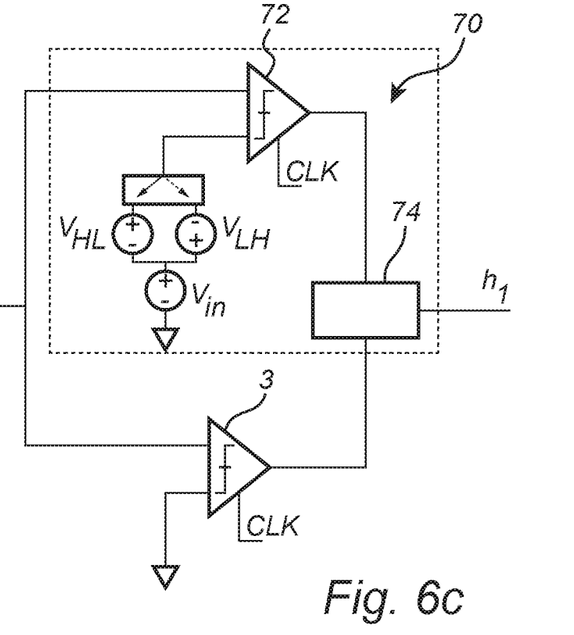

FIG. 6c schematically illustrates a tap coefficient adaption circuit 70 designed to take the hysteresis of the comparator 3 into account. Similar to the circuit 60 of FIG. 6a, the circuit 70 comprises an input stage including an auxiliary comparator 72. The auxiliary comparator 72 may be a dynamic comparator implementing a reset phase to remove or at least minimize hysteresis. This is feasible since the tap coefficient adaption circuit 70 may operate at a fraction of the speed of the main data path. The circuit 70 further comprises a tap coefficient determination stage 74 configured to output the first tap coefficient $h_1$. The first tap coefficient $h_1$ need not be in a voltage domain but may in the implementation shown in FIG. 4 instead be a control word for the current source 12. Hence, $I_{TAP1}$ may be considered a function of $h_1$ which is translated to a voltage level shift through the resistive loads RL, i.e. $k_1+k_{HYST}=I_{TAP1}(h_1)*R_L$.

A first auxiliary comparator input of the auxiliary comparator 72 is coupled to a signal input of the system 1. Thus the auxiliary comparator 72 and the static comparator 3 are coupled to a same signal input, i.e. are responsive to a same input signal. A second auxiliary comparator input is coupled to an output of a threshold selector circuit 76. The threshold selector circuit 76 is configured to output one of two threshold levels $V_{IN}+V_{HL}$ or $V_{IN}-V_{LH}$ responsive to the output of the static comparator 3. The threshold of the auxiliary comparator 74 is hence switchable between the two threshold levels $V_{IN}+V_{HL}$ or $V_{IN}-V_{LH}$. Hence, the difference between these two thresholds (which may be referred to as a third threshold and a fourth threshold of the auxiliary comparator) may correspond to, or advantageously be equal to or at least substantially equal to the difference between the two thresholds of the static comparator (which may be referred to as a first and a second threshold of the static comparator).

Figure 6D:
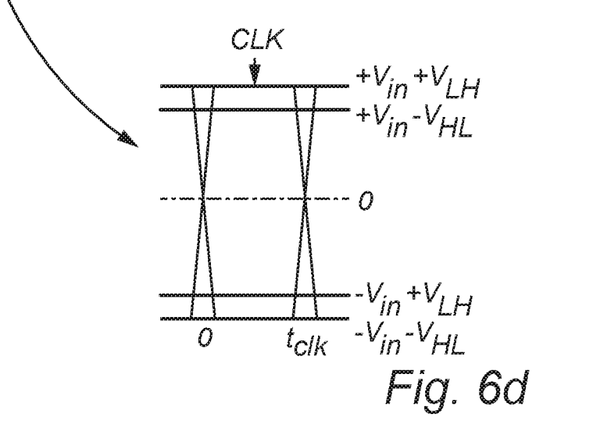

The equalized eye diagram for the auxiliary comparator 74 is shown in FIG. 6d. As may be seen, the adaptive threshold results in a shifting of the eye diagram in correspondence with the hysteresis of the comparator 3.

When comparing the schematics of FIG. 4 and FIG. 6 it should be noted that FIG. 6 is a simplified single-ended representation of the actual differential implementation detailed in FIG. 4. Accordingly, a threshold that is represented as ground at FIG. 6(c) comparator 3 means a zero differential threshold.

Figure 7:
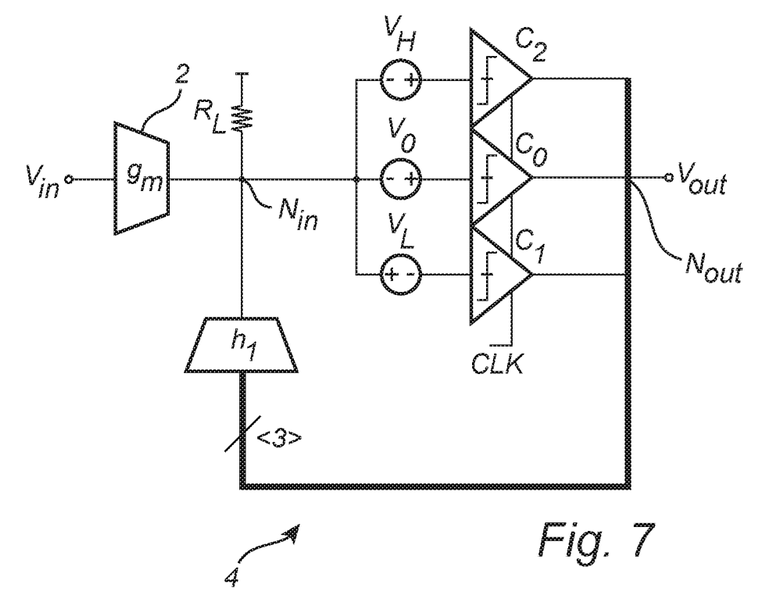
FIG. 7 is a schematic of an equalizer system comprising plural static comparators.

FIG. 7 shows an equalizer system comprising three static comparators C0, C1, C2 to be used in 4-PAM modulation, for instance. Each of the comparators C0, C1, C2 is configured in a manner corresponding to the static comparator 3 discussed above. The comparators C0, C1, C2 may further be formed in a same process and with a same footprint on the wafer or chip. The comparators C0, C1, C2 are coupled between a common input node $N_{IN}$ and a common output node $N_{OUT}$.

The feedback path 3 is coupled from the output node $N_{OUT}$ to the input node $N_{IN}$. FIG. 7 only shows the first filter tap h1 but further filter taps may be provided in a corresponding manner. In line with the above description, the tap coefficient of the first filter tap h1 is set such that a signal level at the common input node $N_{IN}$ is shifted to compensate for the hysteresis of the comparators C0, C1, C2. A tap coefficient adaption engine as shown in FIG. 6c may be coupled to one of the C1 and/or C2 comparator outputs, in order to determine the proper tap coefficient for the first filter tap.

As schematically shown, the signal inputs of the comparators C0, C1, C2 is shifted by a respective amount, effectively offsetting the threshold voltages of the comparators C0, C1, C2 by $V_0$, $V_L$ and $V_H$ respectively. Thereby, the comparators may together distinguish between four different input levels: $V_{IN} \leq V_L$; $V_L \leq V_{IN} \leq V_0$; $V_0 \leq V_{IN} \leq V_H$; $V_{IN} \geq V_H$.

Figure 8:
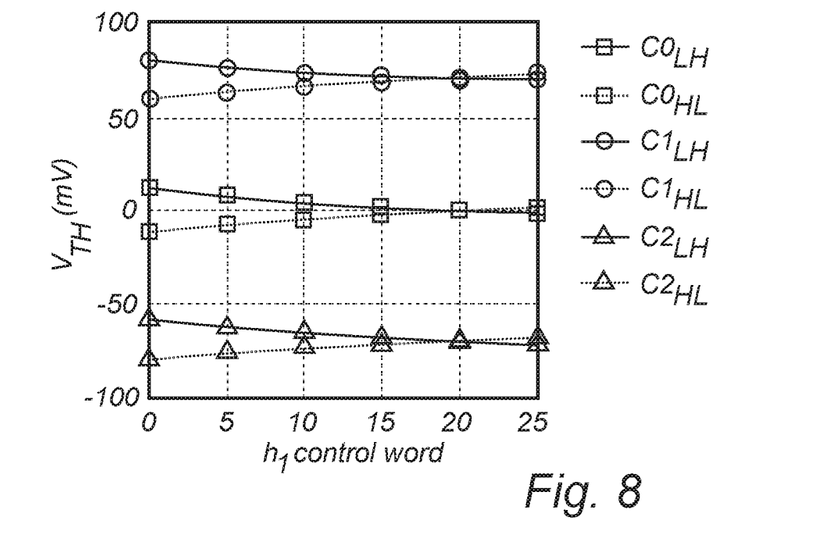
FIG. 8 is a diagram illustrating hysteresis compensation for the static comparators shown in FIG. 7.

FIG. 8 shows the effective threshold voltages of the comparators C0, C1, C2 in FIG. 7 as a function of the magnitude of the h1 control word. As may be seen at $h_1=20$ each comparator C0, C1, C2 is substantially free from hysteresis.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. An equalizer system comprising a decision feedback equalizer (DFE), the DFE comprising:
   a static comparator configured as a decision device of the DFE; and
   a feedback path comprising a set of filter taps including at least a first filter tap;
   wherein the static comparator presents hysteresis and wherein a tap coefficient of the first filter tap is set such that an input signal level of the static comparator is shifted to compensate for the hysteresis.

2. An equalizer system according to claim 1, further comprising a tap coefficient adaption circuit, the tap coefficient adaption circuit comprising:
   an input stage comprising an auxiliary comparator with an adjustable threshold, the auxiliary comparator further having an auxiliary comparator input coupled to a signal input of the equalizer system and having an auxiliary comparator output:
      wherein said adjustable threshold is set to a third threshold in response to a high-level output signal level at the output of the static comparator, and
      wherein said adjustable threshold is set to a fourth threshold in response to a low-level output signal level at the output of the static comparator; and
   a coefficient determination stage having a first input coupled to the auxiliary comparator output and a second input coupled to an output of the static comparator, and being configured to determine said tap coefficient to reduce an error between a signal received at the first input and a signal received at the second input.

3. An equalizer system according to claim 2, wherein the static comparator presents a first threshold in response to an increasing input signal level and a second threshold in response to a decreasing input signal level, and wherein the tap coefficient adaption circuit is configured such that a difference between the third and fourth thresholds of the auxiliary comparator corresponds to a difference between the first and second thresholds.

4. An equalizer system according to claim 1, further comprising a tap coefficient adaption circuit, the tap coefficient adaption circuit comprising:
   an input stage comprising:
      an auxiliary comparator having a first auxiliary comparator input coupled to a signal input of the equalizer system, the auxiliary comparator further having a second auxiliary comparator input and an auxiliary comparator output, and a threshold selector circuit having an output coupled to the second auxiliary comparator input and being configured to output a third threshold level to the second auxiliary comparator input in response to a high-level output signal level at the output of the static comparator, and a fourth threshold level to the second auxiliary comparator input in response to a low-level output signal level at the output of the static comparator; and the tap coefficient adaption circuit further comprising a coefficient determination stage having a first input coupled to the auxiliary comparator output and a second input coupled to an output of the static comparator, and being configured to determine said tap coefficient to reduce an error between a signal received at the first input and a signal received at the second input.

5. An equalizer system according to claim 4, wherein the static comparator presents a first threshold in response to an increasing input signal level and a second threshold in response to a decreasing input signal level, and wherein the threshold selector circuit is configured such that a difference between the third and fourth threshold levels corresponds to a difference between the first and second thresholds.

6. An equalizer system according to claim 1, wherein said static comparator forms a first static comparator and the equalizer system further comprises a second static comparator presenting hysteresis, the first and the second static comparators being coupled between a common input node and a common output node, and wherein the feedback path is coupled from the common output node to the common input node via the set of filter taps and wherein the tap coefficient of the first filter tap is set such that a signal level at the common input node is shifted to compensate for the hysteresis of the first and the second static comparators.

7. An equalizer system according to claim 6, further comprising a tap coefficient adaption circuit, the tap coefficient adaption circuit comprising:

an input stage comprising an auxiliary comparator with an adjustable threshold, the auxiliary comparator further having an auxiliary comparator input coupled to said common input node of the equalizer system and having an auxiliary comparator output:

wherein said adjustable threshold is set to a third threshold in response to a high-level output signal level at the output of the first static comparator, and wherein said adjustable reference is set to a fourth threshold in response to a low-level output signal level at the output of the first static comparator; and a coefficient determination stage having a first input coupled to the auxiliary comparator output and a second input coupled to an output of the static comparator, and being configured to determine said tap coefficient to reduce an error between a signal received at the first input and a signal received at the second input.

8. An equalizer system according to claim 7, wherein the first static comparator presents a first threshold in response to an increasing input signal level and a second threshold in response to a decreasing input signal level, and the second static comparator presents a fifth threshold in response to an increasing input signal level and a sixth threshold in response to a decreasing input signal level, wherein a difference between the first and the second threshold corresponds to a difference between the fifth and sixth threshold, and wherein the tap coefficient adaption circuit is configured such that a difference between the third and fourth thresholds of the auxiliary comparator corresponds to a difference between the first and second thresholds.

9. An equalizer system according to claim 6, further comprising a tap coefficient adaption circuit, the tap coefficient adaption circuit comprising:

an input stage comprising:

an auxiliary comparator having a first auxiliary comparator input coupled to said common input node of the equalizer system, the auxiliary comparator further having a second auxiliary comparator input and an auxiliary comparator output, and a threshold selector circuit having an output coupled to the second auxiliary comparator input and being configured to output a third threshold level to the second auxiliary comparator input in response to a high-level output signal level at the output of the first static comparator, and a fourth threshold level to the second auxiliary comparator input in response to a low-level output signal level at the output of the first static comparator; and the tap coefficient adaption circuit further comprising a coefficient determination stage having a first input coupled to the auxiliary comparator output and a second input coupled to an output of the static comparator, and being configured to determine said tap coefficient to reduce an error between a signal received at the first input and a signal received at the second input.

10. An equalizer system according to claim 9, wherein the first static comparator presents a first threshold in response to an increasing input signal level and a second threshold in response to a decreasing input signal level, and the second static comparator presents a fifth threshold in response to an increasing input signal level and a sixth threshold in response to a decreasing input signal level, wherein a difference between the first and the second threshold corresponds to a difference between the fifth and sixth threshold, and wherein the tap coefficient adaption circuit is configured such that a difference between the third and fourth thresholds of the auxiliary comparator corresponds to a difference between the first and second thresholds.

11. A method for operating an equalizer system, the method comprising:

feeding an input signal to a decision feedback equalizer (DFE) of the equalizer system, the DFE comprising a static comparator configured as a decision device of the DFE, the static comparator presenting hysteresis, and the DFE further comprising a feedback path comprising a set of filter taps including at least a first filter tap; and setting a tap coefficient of the first tap such that an input signal level of the static comparator is shifted to compensate for the hysteresis.

12. A method according to claim 11, further comprising:

comparing, by an auxiliary comparator, said input signal to an adjustable threshold, wherein said adjustable threshold is set to a third threshold in response to a high-level output signal level at the comparator output, and wherein said adjustable threshold is set to a fourth threshold in response to a low-level output signal level at the comparator output; and determining said tap coefficient to reduce an error between a signal output by the auxiliary comparator and a signal output by the static comparator.

13. A method according to claim 12, wherein the static comparator presents a first threshold in response to an increasing input signal level and a second threshold in response to a decreasing input signal level, and wherein the third and fourth thresholds are set such that a difference between the third and fourth thresholds corresponds to a difference between the first and second thresholds.

\* \* \* \* \*